United States Patent
Ikuta et al.

(10) Patent No.: US 12,112,921 B2
(45) Date of Patent: Oct. 8, 2024

(54) PLASMA PROCESSING METHOD AND PLASMA PROCESSING APPARATUS

(71) Applicant: TOKYO ELECTRON LIMITED, Tokyo (JP)

(72) Inventors: Hiroyuki Ikuta, Nirasaki (JP); Hirokazu Ueda, Nirasaki (JP); Yutaka Fujino, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 692 days.

(21) Appl. No.: 17/277,188

(22) PCT Filed: Jul. 17, 2019

(86) PCT No.: PCT/JP2019/028037
§ 371 (c)(1),
(2) Date: Nov. 3, 2021

(87) PCT Pub. No.: WO2020/059273
PCT Pub. Date: Mar. 26, 2020

(65) Prior Publication Data
US 2022/0223378 A1     Jul. 14, 2022

(30) Foreign Application Priority Data

Sep. 20, 2018  (JP) .................................. 2018-175634

(51) Int. Cl.
*H01J 37/32*      (2006.01)
*H01L 21/67*     (2006.01)

(52) U.S. Cl.
CPC .. *H01J 37/32201* (2013.01); *H01J 37/32091* (2013.01); *H01J 37/32449* (2013.01);
(Continued)

(58) Field of Classification Search
None
See application file for complete search history.

(56) References Cited

U.S. PATENT DOCUMENTS

2007/0054046 A1* 3/2007 Ishizaka .................. C23C 16/16
                                                                       427/248.1
2015/0187582 A1* 7/2015 Ueda .................. H01L 29/66803
                                                                           438/513
(Continued)

FOREIGN PATENT DOCUMENTS

KR    10-2017-0122133 A    11/2017
KR    10-2017-0141117 A    12/2017
WO    WO 2013-008878 A1     1/2013

OTHER PUBLICATIONS

PCT International Search Report and Written Opinion, PCT Application No. PCT/JP2019/028037, Oct. 15, 2019, 6 pages (with English translation of PCT International Search Report).
(Continued)

*Primary Examiner* — Shamim Ahmed
(74) *Attorney, Agent, or Firm* — Fenwick & West LLP

(57) ABSTRACT

This plasma processing method comprises: arranging a substrate in a region away from a microwave plasma generation region in a chamber; setting the pressure in the chamber to 1 Torr or higher; introducing microwaves from a microwave plasma source in the chamber, generating microwave plasma by introducing a processing gas containing a reducing gas, and diffusing active species from the microwave plasma in the microwave plasma generation region to the substrate side; and applying high-frequency power to the substrate to generate cathode-coupled plasma near the substrate and attract ions near the substrate to the substrate.

6 Claims, 10 Drawing Sheets

(52) U.S. Cl.
CPC .. *H01J 37/32724* (2013.01); *H01J 37/32834* (2013.01); *H01J 2237/334* (2013.01)

(56) References Cited

U.S. PATENT DOCUMENTS

| | | | | |
|---|---|---|---|---|
| 2016/0111342 A1* | 4/2016 | Huang | ................ | C23C 14/5826 |
| | | | | 156/345.24 |
| 2016/0233100 A1* | 8/2016 | Godet | ............... | H01L 29/66803 |
| 2017/0032933 A1* | 2/2017 | Harada | ............... | H01J 37/3222 |
| 2018/0301582 A1* | 10/2018 | Uto | ...................... | H01L 31/202 |

OTHER PUBLICATIONS

Goto, T. et al. "Observation of Sputtering of yttrium from $Y_2O_3$ Ceramics by Low-Energy Ar, Kr, and Xe Ion Bombardment in Microwave-Excited Plasma," Japanese Journal of Applied Physics, 128003, 3 pages, 2015, vol. 54.

* cited by examiner

HIGH PRESSURE CCP

PLASMA PROCESSING METHOD AND PLASMA PROCESSING APPARATUS

TECHNICAL FIELD

The present disclosure relates to a plasma processing method and a plasma processing apparatus.

BACKGROUND

In a semiconductor device manufacturing process, plasma processing is used for substrate surface modification or etching process. A reducing gas such as a hydrogen gas, a halogen-based gas, or the like is widely used for such plasma processing.

Conventionally, a parallel plate type plasma processing apparatus for generating capacitively coupled plasma has been widely used as an apparatus for performing such plasma processing. However, recently, a microwave plasma processing apparatus attracts attention as a plasma processing apparatus capable of further reducing a plasma damage to a substrate.

For example, Patent Document 1 discloses a technique for generating microwave plasma by introducing microwaves into a processing chamber where a substrate is disposed and etching a silicon film by converting a processing gas containing $Cl_2$ gas which is a halogen-based gas into plasma.

PRIOR ART DOCUMENTS

Patent Documents

Patent Document 1: International Patent Application Publication No. WO2013/008878

SUMMARY

Problems to be Resolved by the Invention

The present disclosure provides a plasma processing method and a plasma processing apparatus capable of reducing a plasma damage to a chamber wall or the like while maintaining a required plasma processing effect.

Means of Solving the Problems

In accordance with an aspect of the present disclosure, there is provided a plasma processing method for generating microwave plasma in a chamber and performing plasma processing on a substrate, comprising: arranging the substrate in a region away from a microwave plasma generation region in the chamber; setting a pressure in the chamber to 1 Torr (133.3 Pa) or higher; introducing microwaves from a microwave plasma source and a processing gas containing a reducing gas into the chamber to generate microwave plasma, and diffusing active species from the microwave plasma in the microwave plasma generation region to the substrate; and applying a radio frequency power to the substrate to generate cathode-coupled plasma near the substrate and attract ions near the substrate to the substrate.

Effect of the Invention

In accordance with the present disclosure, there are provided a plasma processing method and a plasma processing apparatus capable of reducing a plasma damage to a chamber wall or the like while maintaining a required plasma processing effect.

DETAILED DESCRIPTION

Figure 1:
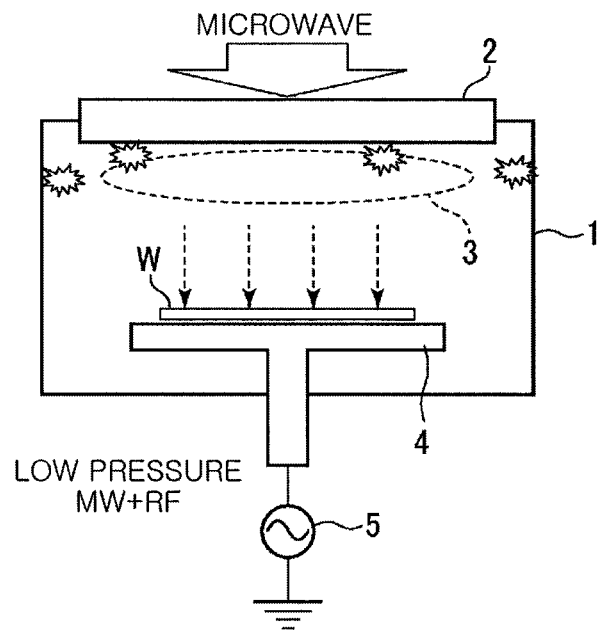
FIG. 1 is a diagram explaining a mechanism of conventional microwave plasma processing in the case of using a reducing gas.

Hereinafter, embodiments will be described with reference to the accompanying drawings.

<Background and Outline>

First, a background and an outline of an etching method according to an embodiment of the present disclosure will be described.

A parallel plate type plasma processing apparatus that has been widely used can generate capacitively coupled plasma between a pair of electrodes and also can perform effective plasma processing using the action of ions. However, the parallel plate type plasma processing apparatus causes a large plasma damage to a substrate or a chamber wall.

On the other hand, in the microwave plasma processing apparatus disclosed in Patent Document 1, a substrate is disposed at a position distant from a plasma generation region, and thus can be processed by plasma having a high electron density and a low electron temperature. Therefore, a damage to the substrate can be reduced compared to that in the parallel plate type plasma processing apparatus.

When plasma processing is performed for surface modification or etching process by a microwave plasma processing apparatus, a pressure in a chamber is reduced (20 mTorr in Patent Document 1) to enhance the effect of ions in a conventional case. However, when the pressure is reduced, a damage to the chamber wall increases in the case of using a reducing gas such as a hydrogen gas or a halogen-based gas as a processing gas. In addition, although it is required to increase a power to enhance the effect of the plasma processing on the substrate, the plasma damage to the chamber wall increases as the power is increased.

As described, the effect of plasma processing can be improved by enhancing the effect of ions by reducing a pressure and by increasing a power. However, the plasma damage to a chamber wall cannot be avoided even in the case of using microwave plasma which is capable of performing plasma processing with a high electron density and a low electron temperature. Depending on the conditions, the chamber wall may be sputtered, which results in the generation of particles or metal contamination. It is known that a sputtering damage cannot be avoided even in the case of using the above-described microwave plasma at a low pressure of 20 Pa or less (Tetsuya Goto et. al, Japanese Journal of Applied Physics 54, 128003 (2015) titled "Observation of sputtering of yttrium from $Y_2O_3$ ceramics by low-energy Ar, Kr, and Xe ion bombardment in microwave-excited plasma").

In other words, since the effect of the plasma processing on the substrate and the damage to the chamber wall occur simultaneously, it was difficult to reduce the plasma damage to the chamber wall while enhancing the effect of the plasma processing on the substrate at the same time.

Therefore, there is provided a method of generating microwave plasma in a chamber and performing plasma processing on a substrate according to one embodiment which includes the following steps (1) to (4): (1) arranging a substrate in a region away from a microwave plasma generation region in a chamber; (2) setting a pressure in the chamber to 1 Torr (133.3 Pa) or higher; (3) introducing microwaves from a microwave plasma source into the chamber, generating microwave plasma by introducing a processing gas containing a reducing gas, and diffusing active species from the microwave plasma in the microwave plasma generation region toward the substrate; and (4) applying a radio frequency (RF) power to the substrate to generate cathode-coupled plasma near the substrate and attracting ions near the substrate to the substrate.

In one embodiment, since the pressure in a chamber is set to a high value, microwave plasma can be concentrated on a plasma source and kept away from a substrate. Further, unlike the conventional processing performed at a low pressure, ions in the microwave plasma are not attracted to the substrate. Therefore, there is no need to consider the anisotropy of the ions, and, in addition, there is no need to increase the microwave power because high-energy ions are not required. Accordingly, the plasma damage to the chamber wall or the like can be reduced. In addition, the required plasma processing effect can be maintained due to the active species diffused from the microwave plasma and the ions positioned near and attracted to the substrate by the RF power applied to the substrate.

In order to effectively achieve the above-described effect, the pressure in a chamber is preferably set to 1.5 Torr (200 Pa) or higher, and more preferably 2 Torr (266.6 Pa) or higher. If the plasma processing of one embodiment can be performed, there is no particular upper limit of the pressure. However, a pressure is preferably 5 Torr (666.5 Pa) or lower.

It is preferable that the microwave power is set such that the processing effect can be obtained and the plasma damage to a chamber wall or the like can be sufficiently reduced. As such, the power density is preferably set to 10 $kW/m^2$ or less, more preferably 7 $kW/m^2$ or less, and further more preferably 2.3 $kW/m^2$ or less. In order to stably ignite and discharge the low-power microwave plasma, it is preferable to use a microwave plasma source having a plurality of microwave radiation units.

The power density of the RF power applied to a substrate is preferably within a range of 0.3 $kW/m^2$ to 2.3 $kW/m^2$, and more preferably within a range of 6 $kW/m^2$ to 1.8 $kW/m^2$, in order to reduce the damage to the chamber wall and obtain a sufficient plasma processing effect.

Further, the distance from a microwave introducing unit of the microwave plasma source to the substrate in the chamber is preferably within a range of 40 mm to 200 mm in order to perform favorable microwave plasma processing on the substrate.

<Plasma Processing Method>

Next, a difference between a mechanism of a conventional plasma processing method and a mechanism of a plasma processing method according to one embodiment will be described.

First, a mechanism of conventional microwave plasma processing using a reducing gas such as a hydrogen gas or a halogen-based gas will be described with reference to FIG. 1. As shown in FIG. 1, in the conventional microwave plasma processing, a substrate W is placed on a substrate support 4 disposed below a plasma generation region in a chamber 1, and microwave plasma 3 is generated by setting a pressure in the chamber 1 to a low pressure of 300 mTorr (40 Pa) or lower and radiating microwaves from a microwave plasma source 2 into the chamber 1. Then, a RF bias power is applied from a RF power supply 5 to the substrate support 4 to attract ions from the microwave plasma 3 to the substrate W.

In this mechanism, the anisotropy of ions irradiated from the microwave plasma 3 cannot be maintained unless the pressure is low, and a high pressure of 1 Torr or higher cannot be applied because the plasma irradiation damage is remarkable.

In this conventional microwave plasma processing mechanism, the plasma in the substrate region is diffused from the microwave plasma 3, and thus has a low electron temperature and causes small damage to the substrate. However, when ions are attracted to the substrate W from the microwave plasma 3 above the substrate W, a high microwave power is required to obtain the plasma processing effect required for the substrate W. Due to this, the microwave plasma 3 acts on the wall of the chamber 1 and causes the generation of particles or metal contamination.

Figure 2:
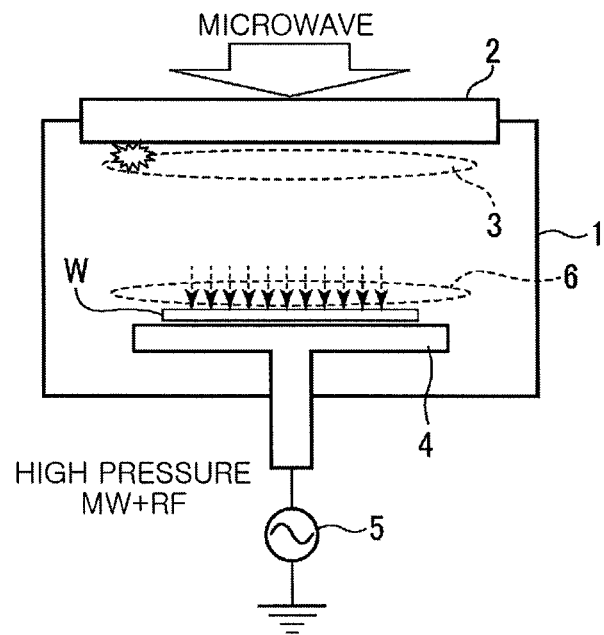
FIG. 2 is a diagram explaining a mechanism of microwave plasma processing in accordance with an embodiment in the case of using a reducing gas.

In contrast, a mechanism of microwave plasma processing according to one embodiment using a reducing gas is shown in FIG. 2. In other words, in one embodiment, the pressure in the chamber 1 is set to a high pressure of 1 Torr (133.3 Pa) or higher, unlike the conventional case. At a high pressure, when ions are attracted from the microwave plasma 3 above the substrate W to the substrate W as in the conventional case, the anisotropy of ion irradiation cannot be maintained and the plasma irradiation damage increases. However, in one embodiment, since the pressure in the chamber 1 is high and the microwave plasma 3 is concentrated on the plasma source 2 side in the chamber 1 and kept away from the substrate W, the contribution of the plasma to the chamber wall is small. Further, since the ions of the microwave plasma 3 are not attracted to the substrate W and only the active species of the microwave plasma 3 are diffused to the substrate W, it is sufficient to generate ions in an energy region suitable for plasma processing. Therefore, it is not necessary to increase the microwave power in order to generate high-energy ions as in the conventional case. Further, the RF power from the RF power supply 5 contributes to the plasma processing by way of generating cathode-coupled plasma 6 near the substrate W and attracting low-energy ions near the substrate to the substrate W. Accordingly, the energy of the ions generated by the microwaves is not increased.

As indicated, by setting the pressure in the chamber high and not attracting ions from the microwave plasma, the plasma can be generated in a narrow region and the power can be lowered so as to reduce the plasma damage to the chamber wall or the like. Further, due to the action of the active species of the microwave plasma and the action of the ions by the application of the RF power, the required plasma processing effect can be obtained even if the microwave power is low. Further, the damage to the substrate can be suppressed by optimizing the RF power supplied to the substrate.

Figure 3:
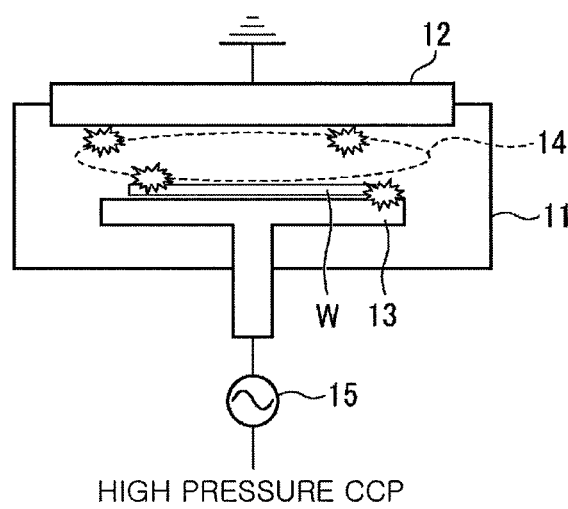
FIG. 3 is a diagram explaining a mechanism in a parallel plate type capacitively coupled plasma processing apparatus.

On the other hands, a parallel plate type capacitively coupled plasma processing apparatus performs processing at a high pressure. As shown in FIG. 3, a RF power is supplied from a RF power supply 15 to generate capacitively coupled plasma 14 between an upper electrode 12 and a lower electrode 13 on which a substrate W is placed, and the plasma has a high electron temperature. Therefore, the substrate W and the wall of a chamber 11 are susceptible to be damaged.

Figure 4A:
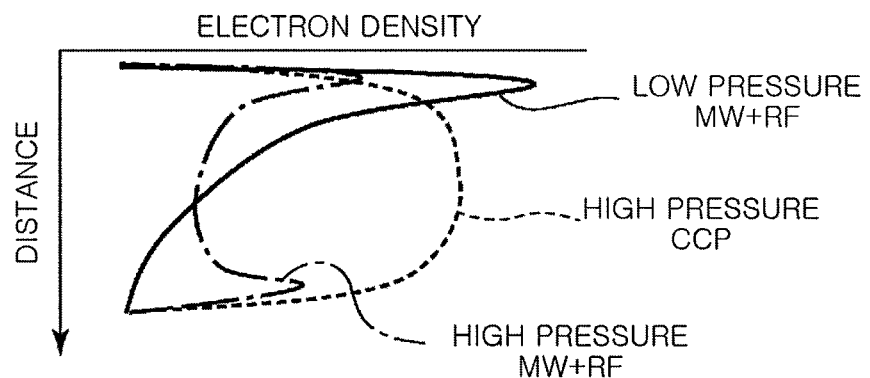
FIG. 4A shows distribution of an electron density of plasma in a height direction in the case of conventional low pressure microwave plasma and radio frequency power (low pressure MW+RF), high pressure microwave plasma and radio frequency power (high pressure MW+RF) according to one embodiment, and high pressure capacitively coupled plasma (high pressure CCP).
Figure 4B:
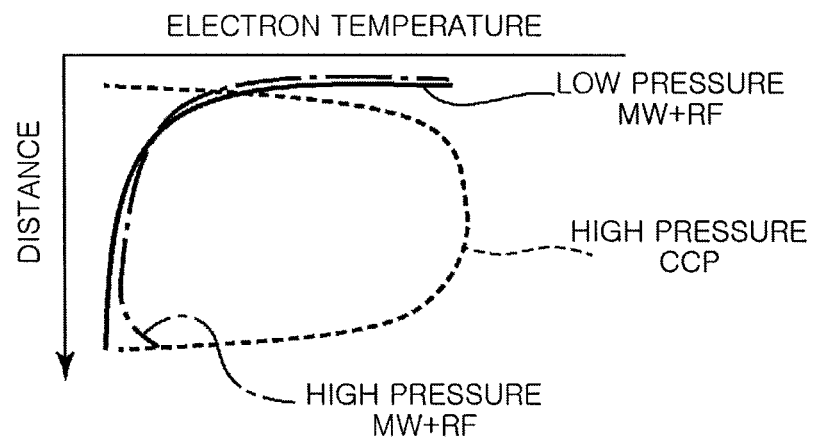
FIG. 4B shows distribution of an electron temperature of plasma in a height direction in the case of conventional low pressure microwave plasma and radio frequency power (low pressure MW+RF), high pressure microwave plasma and radio frequency power (high pressure MW+RF) according to one embodiment, and high pressure capacitively coupled plasma (high pressure CCP).

FIG. 4A shows the electron density distribution of plasma in a height direction, and FIG. 4B shows the electron temperature distribution of plasma in a height direction. FIGS. 4A and 4B show the case of conventional low pressure microwave plasma and radio frequency power (low pressure MW+RF), high pressure microwave plasma and radio frequency power (high pressure MW+RF) according to one embodiment, and high pressure capacitively coupled plasma (high pressure CCP). As illustrated in FIGS. 4A and 4B, in the case of high pressure MW+RF according to one embodiment, an electron density is low at a portion directly below the microwave plasma source and a high-electron density region is concentrated on the plasma source side, compared to the conventional case of low pressure MW+RF. Further, the electron density near the substrate is higher in the case of high pressure MW+RF according to one embodiment. On the other hand, the electron temperature in the conventional case of low pressure MW+RF is equal to that in the case of high pressure MW+RF according to one embodiment. In the case of high pressure CCP, the electron density and the electron temperature are uniformly high between the electrodes.

<Plasma Processing Apparatus>

Next, an example of a plasma processing apparatus for performing a plasma processing method according to one embodiment will be described. This plasma processing apparatus performs surface modification or etching process on a substrate using a hydrogen gas or a halogen-based gas.

Figure 5:
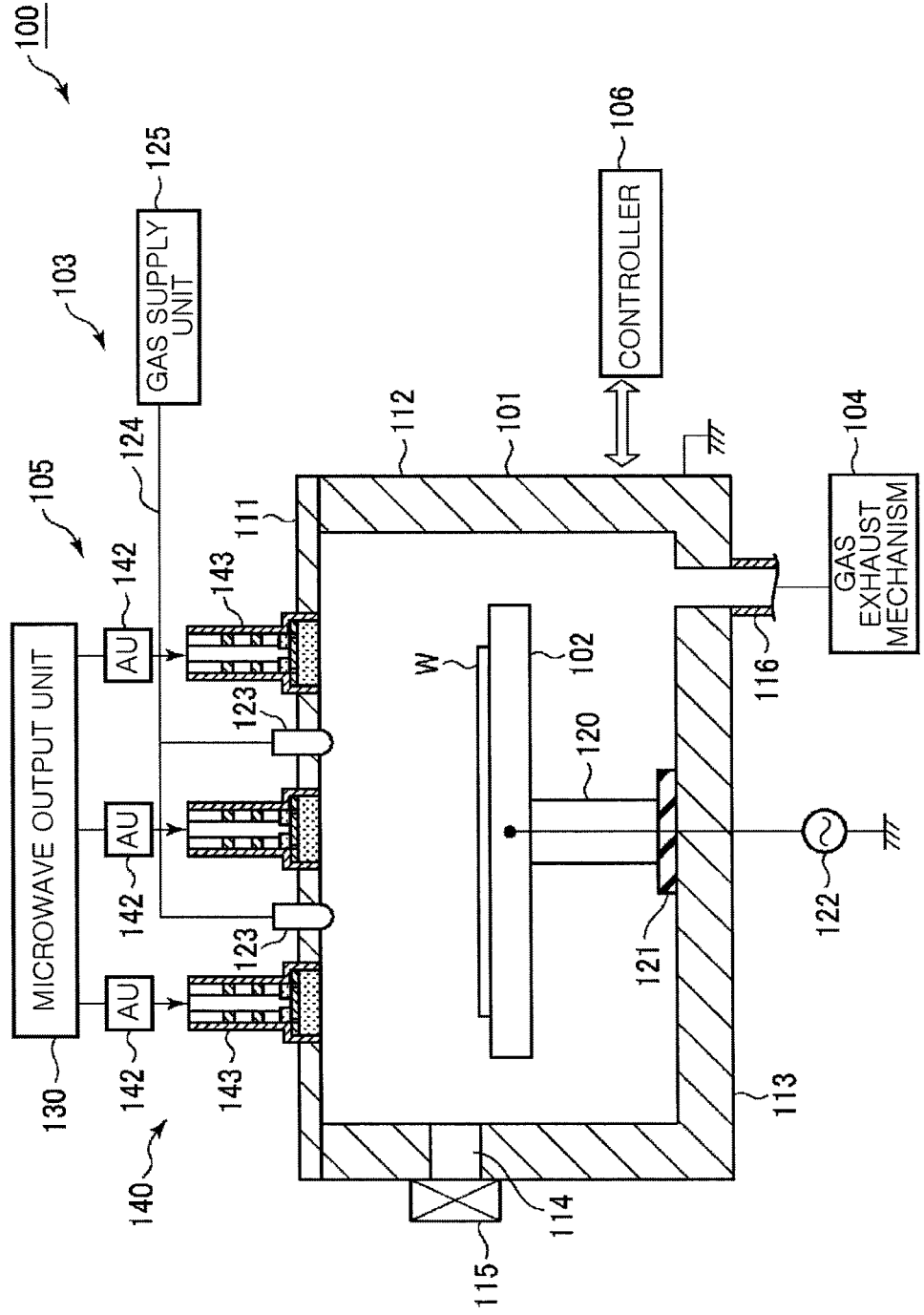
FIG. 5 is a cross-sectional view schematically showing an example of a plasma processing apparatus for performing a plasma processing method according to one embodiment.
Figure 6:
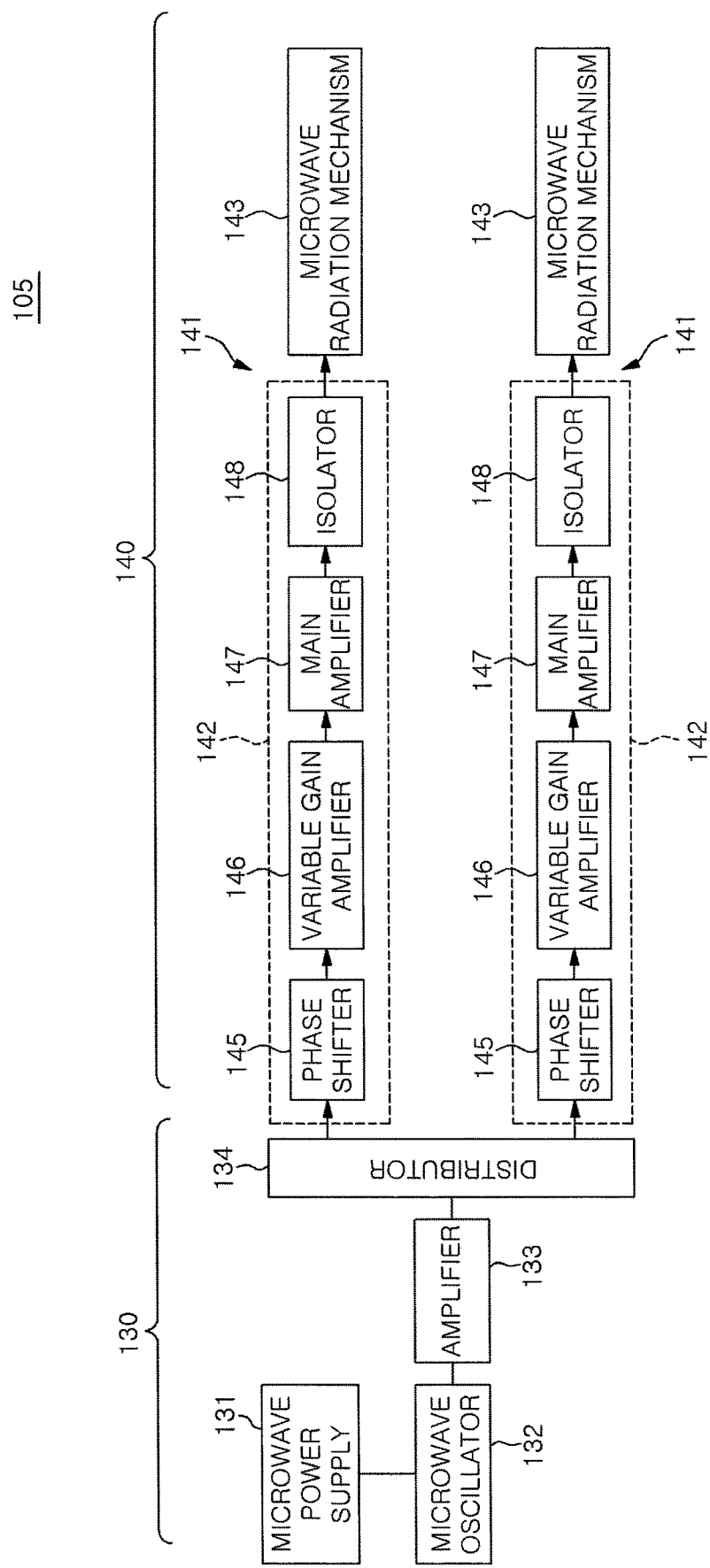
FIG. 6 shows a configuration of a microwave plasma source of the plasma processing apparatus shown in FIG. 5.
Figure 7:
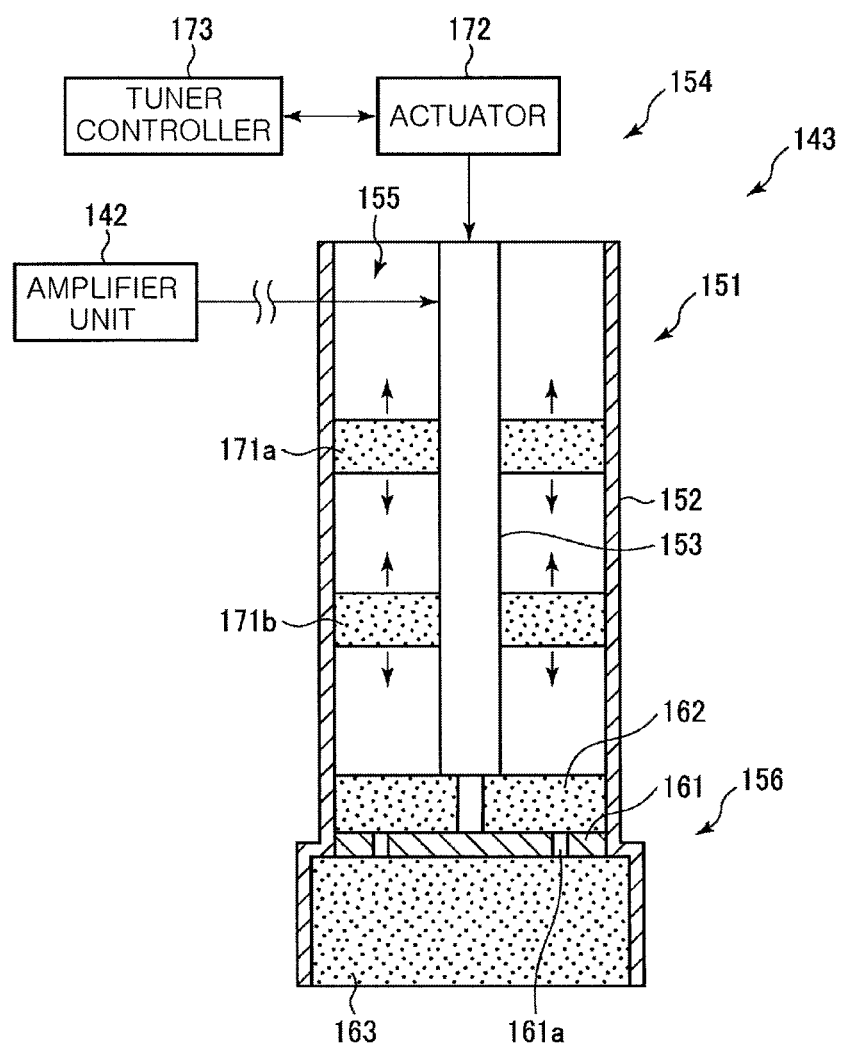
FIG. 7 is a cross-sectional view schematically showing a microwave radiation unit in the plasma processing apparatus shown in FIG. 5.
Figure 8:
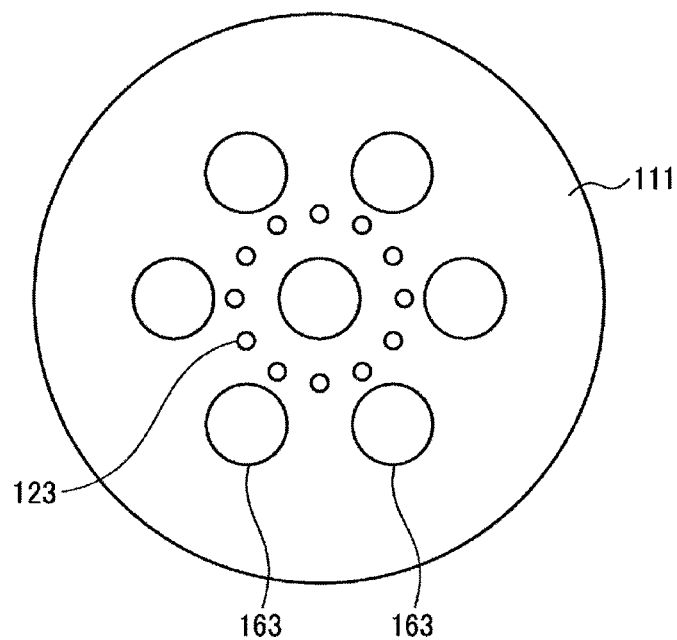
FIG. 8 is a bottom view schematically showing a ceiling wall of a processing chamber in the plasma processing apparatus shown in FIG. 5.

FIG. 5 is a cross-sectional view schematically showing an example of a plasma processing apparatus for performing a plasma processing method according to one embodiment. FIG. 6 shows a configuration of a microwave plasma source of the plasma processing apparatus of FIG. 5. FIG. 7 is a cross-sectional view schematically showing a microwave radiation unit in the plasma processing apparatus of FIG. 5. FIG. 8 is a bottom view schematically showing a ceiling wall of the chamber in the plasma processing apparatus of FIG. 5.

The plasma processing apparatus 100 includes a chamber 101, a substrate support 102, a gas supply mechanism 103, a gas exhaust mechanism 104, a microwave plasma source 105, and a controller 106.

The chamber 101 accommodates a substrate W such as a semiconductor wafer or the like, and is made of a metal material, e.g., aluminum having an anodically oxidized surface. The chamber 101 has a substantially cylindrical shape. The chamber 101 has a plate-shaped ceiling wall 111 and a bottom wall 113, and a sidewall 112 that connects the ceiling wall 111 and the bottom wall 113. An inner wall of the chamber 101 may be coated with yttria ($Y_2O_3$) or the like.

The ceiling wall 111 has a plurality of openings into which a microwave radiation mechanism and a gas inlet, which will be described later, of the microwave plasma source 105 are fitted. The sidewall 112 has a loading/unloading port 114 for loading/unloading the substrate W into/from a transfer chamber (not shown) adjacent to the chamber 101. The loading/unloading port 114 is opened and closed by a gate valve 115. A gas exhaust line 116 is connected to the bottom wall 113.

The substrate support 102 allows the substrate W to be placed thereon, and has a disc shape. The substrate support 102 is made of a metal material, e.g., aluminum having an anodically oxidized surface, or a ceramic material such as aluminum nitride (AlN). The substrate support 102 is supported by a metallic cylindrical support member 120 extending upward from the center of a bottom portion of the chamber 101 via an insulating member 121. An electrostatic chuck (not shown) for adsorbing and holding the substrate W by an electrostatic force is disposed on an upper surface of the substrate support 102.

Further, elevating pins (not shown) for raising and lowering the substrate W are disposed in the substrate support 102 to protrude from and retract below an upper surface of the substrate support 102. Further, a temperature control mechanism (not shown) including either one or both of a temperature control medium flow path through which a temperature control medium flows and a heater are disposed in the substrate support 102 to control the temperature of a substrate on the substrate support 102 to a predetermined temperature.

In order to perform favorable plasma processing, the substrate support 102 is preferably positioned such that the distance from a bottom surface of the ceiling wall 111, which is a microwave radiation surface of a microwave radiation mechanism 143, to the substrate W is within a range of 40 mm to 200 mm.

A RF power supply 122 for generating cathode-coupled plasma is electrically connected to the substrate support 102. When the substrate support 102 is made of ceramic, an electrode is disposed in the substrate support 102 and the RF power supply 122 is electrically connected thereto. A frequency of the RF power supply 122 is preferably within a range of 0.4 MHz to 27.12 MHz.

The gas supply mechanism 103 for supplying a processing gas for performing plasma processing into the chamber 101 includes a plurality of gas inlet nozzles 123 and a gas supply unit 125 for supplying the gas to the gas inlet nozzles 123 through a gas supply line 124. The gas inlet nozzles 123 are fitted into the openings formed in the ceiling wall 111 of the chamber 101. The gas supply unit 125 includes gas supply sources for various gases such as a reducing gas for plasma processing, a rare gas that is a plasma generating gas, and the like, lines that connect the gas supply sources and the gas supply line 124, and valves, flow rate controllers, and the like disposed in the lines.

The gas exhaust mechanism 104 for exhausting the chamber 101 is disposed in the gas exhaust line 116 connected to the bottom wall 113. The gas exhaust mechanism 104 includes a vacuum pump and a pressure control valve. The chamber 101 is exhausted through the gas exhaust line 116 by the vacuum pump of the gas exhaust mechanism 104. The pressure in the chamber 101 is controlled by the pressure control valve based on a value measured by a pressure gauge.

The microwave plasma source 105 generates microwave plasma in the chamber 101. The microwave plasma source 105 is disposed above the chamber 101 and introduces electromagnetic waves (microwaves) into the chamber 101 to generate plasma.

As shown in FIG. 5, the microwave plasma source 105 includes the ceiling wall 111 of the chamber 101 that functions as a ceiling plate, a microwave output unit 130, and an antenna unit 140. The microwave output unit 130 generates microwaves as well as distributing and outputting the microwaves to a plurality of paths. The antenna unit 140 introduces the microwaves outputted from the microwave output unit 130 into the chamber 101.

As shown in FIG. 6, the microwave output unit 130 includes a microwave power supply 131, a microwave oscillator 132, an amplifier 133, and a distributor 134. The microwave oscillator 132 is a solid-state oscillator for oscillating microwaves (e.g., PLL oscillation) with a frequency of, e.g., 860 MHz. The frequency of the microwave is not limited to 860 MHz, and may be within a range of 700 MHz to 10 GHz, e.g., 2.45 GHz, 8.35 GHz, 5.8 GHz, 1.98 GHz or the like. The amplifier 133 amplifies the microwaves oscillated by the microwave oscillator 132. The distributor 134 distributes the microwaves amplified by the amplifier 133 to a plurality of paths. The distributor 134 distributes the microwaves while matching an input impedance and an output impedance.

As shown in FIG. 6, the antenna unit 140 includes a plurality of antenna modules 141. The plurality of antenna modules 141 respectively introduce the microwaves distributed by the distributor 134 into the chamber 101. The plurality of antenna modules 141 have the same configuration. Each of the antenna modules 141 has an amplifier unit (AU) 142 for mainly amplifying and outputting the distributed microwaves, and a microwave radiation mechanism 143 for radiating the microwaves outputted from the amplifier unit 142 into the chamber 101. The microwave radiation mechanism 143 functions as a microwave radiation unit.

The amplifier unit 142 includes a phase shifter 145, a variable gain amplifier 146, a main amplifier 147, and an isolator 148. The phase shifter 145 shifts the phase of the microwaves. The variable gain amplifier 146 controls the power level of the microwaves to be inputted to the main amplifier 147. The main amplifier 147 is configured as a solid-state amplifier. The isolator 148 separates the microwaves that are reflected by an antenna unit of the microwave radiation mechanism 143, which will be described later, and directed toward the main amplifier 147.

As shown in FIG. 5, the plurality of multiple microwave radiation mechanisms 143 are disposed at the ceiling wall 111. Further, as shown in FIG. 7, the microwave radiation mechanism 143 has a cylindrical outer conductor 152 and an inner conductor 153 coaxially arranged within the outer conductor 152. The microwave radiation mechanism 143 further includes a coaxial tube 151, a tuner 154, a power supply unit 155, and an antenna unit 156.

The coaxial tube 151 has the outer conductor 152, the inner conductor 153, and a microwave transmission line disposed therebetween.

The power supply unit 155 supplies the microwaves amplified by the amplifier unit 142 to the microwave transmission line, and the microwaves amplified by the amplifier unit 142 are introduced from the side of the upper end portion of the outer conductor 152 through a coaxial cable. For example, the power supply unit 155 supplies a microwave power to the microwave transmission line between the outer conductor 152 and the inner conductor 153 by radiating the microwaves using a power supply antenna, and the microwave power propagates toward the antenna unit 156.

The antenna unit 156 for radiating the microwaves from the coaxial tube 151 into the chamber 101 is disposed at a lower end portion of the coaxial tube 151. The antenna unit 156 includes a disk-shaped planar antenna 161 connected to a lower end of the inner conductor 153, a wave retardation member 162 disposed at an upper surface side of the planar antenna 161, and a microwave penetrating plate 163 disposed at a bottom surface side of the planar antenna 161. The microwave penetrating plate 163 is fitted to the ceiling wall 111, and the bottom surface of the microwave penetrating plate 163 is exposed to the inner space of the chamber 101. The planar antenna 161 has a slot 161a formed therethrough. The shape of slot 161a is appropriately set such that the microwaves are efficiently radiated. A dielectric may be inserted into the slot 161a. The wave retardation member 162 is made of a material whose dielectric constant is greater than that of the vacuum. The phase of the microwaves can be adjusted depending on the thickness of the wave retardation member 162 to maximize the radiation energy of the microwaves. The microwave penetrating plate 163 is also made of a dielectric and has a shape that allows the microwaves to be radiated efficiently in a TE mode. The microwaves that have transmitted the microwave penetrating plate 163 generate plasma in the inner space of the chamber 101. The wave retardation member 162 and the microwave transmitting plate 163 may be made of, e.g., quartz, ceramic, fluorine-based resin such as polytetrafluoroethylene resin, polyimide-based resin, or the like.

The tuner 154 matches an impedance of a load with a characteristic impedance of the microwave power supply 131, and is configured as a slug tuner. As shown in FIG. 7, the tuner 154 includes two slugs 171a and 171b disposed at a base end side (upper end side) of the coaxial tube 151 compared to the antenna unit 156, an actuator 172 for individually driving the two slugs, and a tuner controller 173 for controlling the actuator 172.

The slugs 171a and 171b are formed in an annular plate-shape and made of a dielectric material such as ceramic or the like. The slugs 171a and 171b are disposed between the outer conductor 152 and the inner conductor 153 of the coaxial tube 151. The actuator 172 individually drives the slugs 171a and 171b by rotating two screws disposed in the inner conductor 153 to be screw-coupled to the slugs 171a and 171b, respectively. Then, the actuator 172 moves the slugs 171a and 171b in a vertical direction based on a command from the tuner controller 173. The tuner controller 173 adjusts the positions of the slugs 171a and 171b such that an impedance of an end portion becomes 50Ω.

The main amplifier 147, the tuner 154, and the planar antenna 161 are arranged close to each other. The tuner 154 and the planar antenna 161 form a lumped constant circuit and function as a resonator. Although there exists impedance mismatch at the installation portion of the planar antenna 161, the impedance is directly tuned with respect to the plasma load by the tuner 154, so that the impedance can be tuned with high precision by including plasma and the influence of the reflection on the planar antenna 161 can be eliminated.

As shown in FIG. 8, in this example, seven microwave radiation mechanisms 143 are provided, and the microwave transmitting plates 163 corresponding thereto are arranged uniformly in a hexagonal close-packed manner. In other words, one of the seven microwave transmitting plates 163 is disposed at the center of the ceiling wall 111, and the other six microwave transmitting plates 163 are arranged around the central microwave penetrating plate 163. The seven microwave transmitting plates 163 are arranged such that the adjacent microwave transmitting plates 163 are spaced apart from each other at an equal interval. Further, the nozzles 123 of the gas supply mechanism 103 are arranged to surround the periphery of the central microwave transmitting plate. The number of the microwave radiation mechanisms 143 is not limited to seven.

The controller 106 is implemented by a computer and controls the respective components of the processing apparatus 100. The controller 106 has a main controller including a CPU that actually controls the respective components, an input device, an output device, a display device, and a storage device. The storage device stores parameters or the like for plasma processing performed by the processing apparatus 100, and a storage medium in which a program, i.e., a processing recipe, for controlling the processing performed by the processing apparatus 100 is stored is set. The main controller of the controller 106 calls a predetermined processing recipe stored in the storage medium, and causes the processing apparatus 100 to perform the predetermined plasma processing based on the processing recipe.

Next, a processing operation in the case of performing plasma processing using a processing gas containing a reducing gas such as a hydrogen gas and a halogen-based gas by the film forming apparatus 100 configured as described above will be described.

First, the substrate W is placed on the substrate support 102 whose temperature has been adjusted to a predetermined temperature by a temperature control mechanism. A processing target film is formed on a surface of a semiconductor wafer as an example of the substrate W. The processing target film may be subjected to surface modification or etching process.

Then, a rare gas that is a plasma generating gas, e.g., an Ar gas, is supplied into the chamber 101 from the gas inlet nozzles 123, and a pressure in the chamber 101 is controlled to a high pressure of 1 Torr (133.3 Pa) or higher by the gas exhaust mechanism 104. The pressure in the chamber 101 is preferably 1.5 Torr (200 Pa) or higher, and more preferably 2 Torr (266.6 Pa) or higher. Further, the pressure in the chamber 101 is preferably 5 Torr (666.5 Pa) or lower.

The microwaves distributed and outputted from the microwave output unit 130 of the microwave plasma source 105 are guided to the antenna modules 141 of the antenna unit 140 and radiated from the microwave radiation mechanisms 143 to ignite the plasma.

In each antenna module 141, the microwaves are individually amplified by the main amplifier 147 configured as the solid-state amplifier, supplied to each microwave radiation mechanism 143, and transmitted through the coaxial tube 151 to reach the antenna unit 156. At that time, the impedance of the microwaves is automatically matched by the slugs 171a and 171b of the tuner 154. In a state where there is substantially no power reflection, the microwaves are radiated from the slots 161a of the planar antenna 161 through the wave retardation member 162 of the antenna unit 156 from the tuner 154. Then, the microwaves are transmitted through the microwave penetrating plate 163 and reach the surface (bottom surface) of the microwave penetrating plate 163 in contact with the plasma to form surface waves. Then, the powers from the antenna units 156 are spatially combined in the chamber 101, and surface wave plasma of an Ar gas is generated in a region directly below the ceiling wall 111. That region serves as a plasma generation region.

When the plasma is ignited, a reducing gas for plasma processing, e.g., a hydrogen gas or a halogen-based gas, is supplied from the gas inlet nozzles 123 and the gas is excited. Further, the RF power is applied from the RF power supply 122 to the substrate support 102.

The excited reducing gas is dissociated and supplied to the substrate W on the substrate support 102. The substrate W is disposed in a region away from the microwave plasma generation region, and the low-electron temperature plasma diffused from the generated microwave plasma is supplied to the substrate W to perform plasma processing on a predetermined film on the surface of the substrate W.

The plasma processing may be, for example, surface modification of a TiN film formed on the surface of the substrate W using plasma of a hydrogen gas that is a reducing gas. By performing this processing, the resistivity of the TiN film is reduced.

In the case of performing the plasma processing for surface modification or etching using a reducing gas by a microwave plasma processing apparatus, conventionally, a RF power was applied to the substrate to utilize the action of ions in the microwave plasma. Therefore, conventionally, a pressure in the chamber was set to a low pressure of 300 mTorr (40 Pa) or lower to enhance the effect of ions. However, when the effect of ions in the microwave plasma is used at such a low pressure, the plasma damage occurs on the chamber wall, which may result in the generation of particles of or metal contamination.

In contrast, in this example, the pressure in the chamber 101 is set to a high pressure of 1 Torr (133.3 Pa) or higher, so that the microwave plasma can be concentrated on the plasma source side and the microwave power can be reduced as described above. Therefore, the plasma damage to the chamber wall or the like can be reduced. Further, due to the action of the low-energy ions by the application of the RF power to the substrate W as well as the action of the active species of the microwave plasma, the required plasma processing effect can be obtained even if the power of the microwave plasma is low.

The plasma processing using a reducing gas may be, e.g., surface modification of a TiN film using a hydrogen gas. In this case, a hydrogen gas and an Ar gas are used as a processing gas, a temperature of the substrate W is set to be within a range of 300° C. to 600° C., e.g., 550° C., and a pressure in the chamber 101 is set to 1 Torr or higher. In this state, the hydrogen gas is excited by the microwave plasma to generate hydrogen radicals or hydrogen ions. When the pressure in the chamber 101 is high, hydrogen ions having an energy that is sufficient for a reducing action without causing a damage to the chamber wall can be generated near the plasma source 105 by the low-power microwaves. By optimally controlling the microwave power, the damage to the chamber wall due to the hydrogen ions can be considerably reduced. Further, the RF power from the RF power supply 122 allows low-energy hydrogen ions near the substrate to be attracted to the substrate W and contribute to the plasma processing without increasing the energy of the hydrogen ions generated by the microwave plasma.

In this microwave plasma processing, by optimally controlling the RF power, the optimal processing effect can be obtained while reducing a damage to the substrate W. Specifically, it is preferable to control the power density of the microwaves emitted from the microwave radiation mechanism 143 to 10 kW/m$^2$ or less, more preferably 7 kW/m$^2$ or less, and further more preferably 2.3 kW/m$^2$ or less. Further, it is preferable to control the power density of the RF power applied from the RF power supply 122 to the substrate W through the substrate support 102 to be within a range of 0.3 kW/m$^2$ to 2.3 kW/m$^2$ and more preferably within a range of 0.6 kW/m$^2$ to 1.8 kW/m$^2$.

In order to reduce the power density of the microwave to 10 kW/m$^2$ or less, preferably 7 kW/m$^2$ or less, more preferably 2.3 kW/m$^2$ or less, it is preferable to distribute and introduce the microwaves from the plurality of microwave irradiation mechanisms 143 into the chamber 101 as in the present embodiment.

In this example, the distributed microwaves are individually amplified by the main amplifier 147, which is a solid-state amplifier, and then are individually introduced into the chamber 101 from the antenna units 156 of the plurality of microwave irradiation mechanisms 143. Then, the surface waves are generated by the distributed and introduced microwaves, and microwave plasma is generated by spatial combination. Therefore, a large isolator or combiner is not required, and the main amplifier 147, the tuner 154, and the planar antenna 161 are arranged close to each other, and the tuner 154 and the planar antenna 161 form a lumped constant circuit and function as a resonator. Accordingly, the impedance mismatch at the installation portion of the planar slot antenna can be tuned including plasma with high precision by the tuner 154. Hence, the influence of reflection is certainly eliminated, and high-precision plasma control can be performed. In addition, since the plurality of microwave transmitting plates 163 are provided, the total area of microwave radiation portion can be reduced, compared to the case where a single microwave penetrating plate is provided, and the microwave power required to stably ignite and discharge the plasma can be reduced. Accordingly, it is relatively easy to set the power density of the microwave to be 10 kW/m$^2$ or less, preferably 7 kW/m$^2$ or less, and more preferably 2.3 kW/m$^2$ or less.

In this example, the case where the number of microwave radiation mechanisms 143 is seven has been described. However, the number of the microwave radiation mechanisms 143 is not limited to seven, and is preferably four or more.

Further, if the power density of the microwave can be appropriately controlled, it is possible to use a microwave plasma source having a single microwave introducing unit having a size corresponding to the substrate W.

Figure 9:
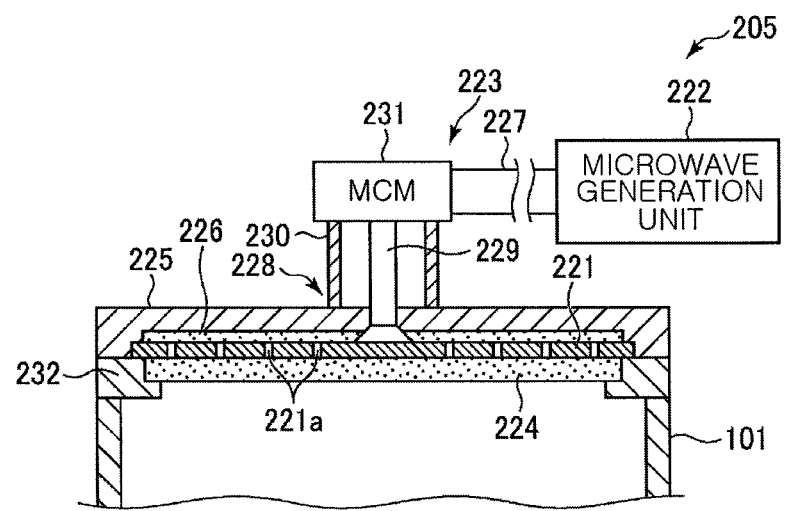
FIG. 9 is a cross-sectional view schematically showing another example of the plasma processing apparatus for performing the plasma processing method according to one embodiment.

FIG. 9 shows an example thereof. In this example, a microwave plasma source 205 is disposed on the chamber 101 via an upper plate 232. The microwave plasma source 205 includes a planar antenna 221, a microwave generation unit 222, a microwave transmitting mechanism 223, and a microwave penetrating plate 224.

The planar antenna 221 is made of a metal, and a plurality of slots 221a for radiating microwaves are formed through the planar antenna 211 in a predetermined pattern. The pattern of the slots 221a is appropriately set such that microwaves are radiated uniformly. For example, in the case of a radial line slot, multiple pairs of slots 221a are arranged concentrically and each pair includes two slots 221a arranged in a T-shape. A shield member 225 of a water-cooling structure is disposed on the planar antenna 221.

The microwave generation unit 222 generates microwaves and has a microwave oscillator. The microwave oscillator may be a magnetron or a solid-state oscillator. The frequency of the microwave oscillated from the microwave oscillator is within a range of 300 MHz to 10 GHz, e.g., 2.45 GHz.

The microwave transmitting mechanism 223 guides the microwaves from the microwave generating unit 222 to the planar antenna 221. The microwave transmitting mechanism 223 includes a wave retardation member 226, a waveguide 227, a coaxial waveguide 228, and a mode conversion mechanism (MCM) 231. The waveguide 227 guides the microwaves from the microwave generation unit 222. The coaxial waveguide 228 has an inner conductor 229 extending upward from the center of the planar antenna 221 and an outer conductor 230 disposed around the inner conductor 229. The mode conversion mechanism 231 is disposed between the waveguide 227 and the coaxial waveguide 228. The microwaves generated by the microwave generation unit 222 propagate through the waveguide 227 in a TE mode, and the vibration mode changed from the TE mode to a TEM mode by the mode conversion mechanism 231. The microwaves in the TEM mode are guided to the wave retardation member 226 through the coaxial waveguide 228, and are radiated from the wave retardation member 226 into the chamber 101 through the slots 221a of the planar antenna 221 and the microwave penetrating plate 224.

The wave retardation member 226 is made of a dielectric having a dielectric constant larger than that of the vacuum. The wave retardation member 226 has a function of reducing the size of the planar antenna 221 by shortening the wavelength of the microwave compared to that in the vacuum.

The microwave penetrating plate 224 is configured as a microwave introducing unit and is made of a dielectric material. The microwave penetrating plate 224 is preferably made of the same dielectric material as that of the wave retardation member 226.

In the microwave plasma source 205 configured as described above, the microwaves generated by the microwave generator 222 are guided to the wave retardation member 226 through the waveguide 227 of the microwave transmitting mechanism 223, the mode conversion mechanism 231, and the coaxial waveguide 228. Then, the microwaves are radiated from the wave retardation member 226 into the chamber 101 through the slots 221a of the planar antenna 221 and the microwave penetrating plate 224. The microwaves spread as surface waves to a region directly below the microwave penetrating plate 224, and plasma is ignited by introducing an Ar gas or the like. That region serves as a plasma generation region.

The reducing gas used for the plasma processing is excited by the plasma diffused from the plasma generation region, dissociated, and supplied to the substrate W placed on the substrate support. Therefore, it is possible to perform plasma processing using plasma with a high electron density and a low electron temperature.

Test Example

Here, a semiconductor wafer having a TiN film formed on a silicon base was prepared as a substrate, and surface modification of the TiN film using a hydrogen gas ($H_2$ gas) and an Ar gas as a processing gas was performed by the plasma processing apparatus shown in FIGS. 5 to 8. This surface modification was performed to improve the resistivity of the TiN film. An antenna unit having a diameter of 88 mm was used for the seven microwave radiation mechanisms.

First, the basic conditions were set as follows: Ar gas flow rate: 800 sccm, $H_2$ gas flow rate: 200 sccm, substrate temperature (substrate support temperature): 550° C., and pressure: 2500 mTorr (333 Pa). Then the test was conducted while changing the microwave power (MW power) and the RF power.

Specifically, the amount of particles (PTCL) and metal contamination (Al and Y) and the resistivity improving effect (resistivity changes (Res.)) were measured while changing the RF power applied to the substrate support 102 in each of the cases of setting the microwave power (MW power) of the microwave radiation mechanism 143 to 550 W (power density: 12.9 kW/m$^2$), 100 W (power density: 2.3 kW/m$^2$), and 0 W (no microwave (MW)). The results thereof are shown in FIGS. 10, 11, and 12.

Figure 10:
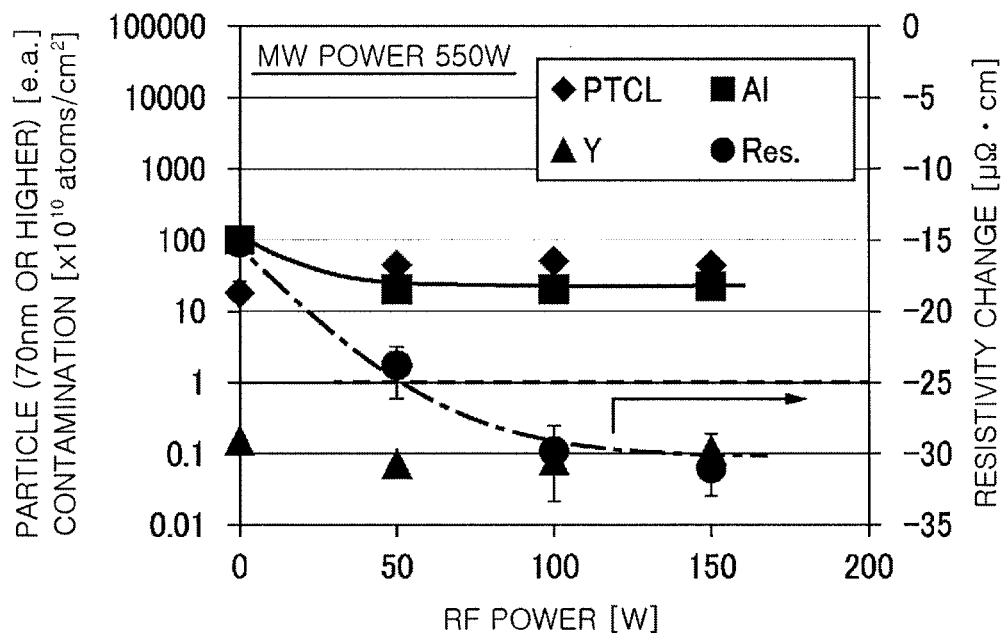
FIG. 10 shows a relationship between an RF power, the amount of particles and metal contamination, and a resistivity improving effect in the case of setting an MW power of each microwave radiation mechanism to 550 W (power density: 12.9 $kW/m^2$).
Figure 11:
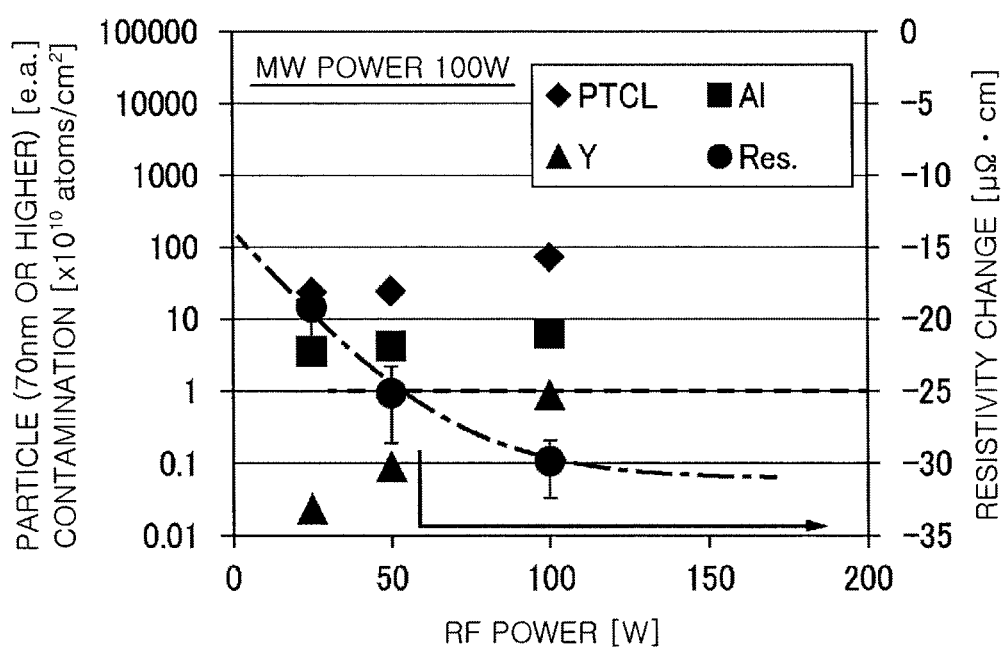
FIG. 11 shows a relationship between an RF power, the amount of particles and metal contamination, and a resistivity improving effect in the case of setting the MW power of each microwave radiation mechanism to 100 W (power density: 2.3 $kW/m^2$).
Figure 12:
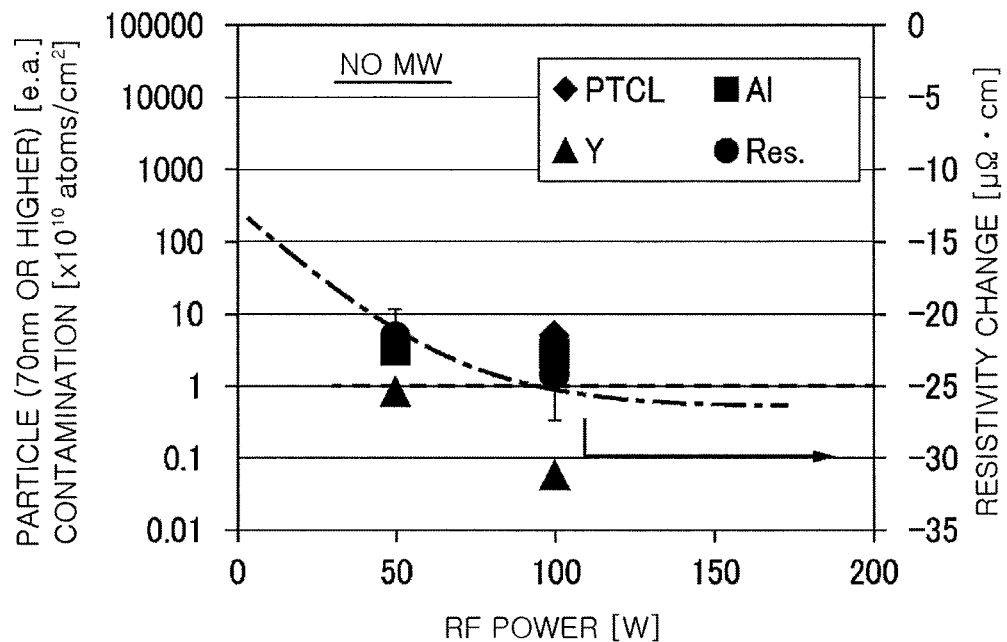
FIG. 12 shows a relationship between an RF power, the amount of particles and metal contamination, and a resistivity improving effect in the case of setting the MW power of the microwave radiation mechanism to 0 W.

As can be seen from FIGS. 10 to 12, it is possible to suppress the metal contamination from the chamber wall while maintaining a high resistivity improving effect by appropriately controlling the MW power and the RF power at a high pressure of 2500 mTorr (333 Pa).

Specifically, regardless of the value of the MW power, the resistivity improving effect is increased by applying the RF power. Further, there is no big difference in the resistivity improving effect between when the MW power is 550 W (power density: 12.9 kW/m$^2$) and when the MW power is 100 W (power density: 2.3 kW/m$^2$). However, Al contamination is suppressed when the MW power is 100 W compared to when the MW power is 550 W. In the case of no MW power, the amount of particles is reduced and the Al contamination is also slightly suppressed, but the resistivity improving effect is small. While the resistivity improving effect is increased as the RF power increases, the amount of particles and the metal contamination are increased if the RF power excessively increases. Since the resistivity improving effect can be achieved at the RF power of 50 W (power density: 0.6 kW/m$^2$), it is appreciated that the RF power is preferably within the range of 50 W to 150 W (power density: 0.6 kW/m$^2$ to 1.8 kW/m$^2$).

Next, the basic conditions were set as follows: Ar gas flow rate: 800 sccm, $H_2$ gas flow rate: 200 sccm, MW power: 550 W (power density: 12.9 kW/m$^2$), and substrate temperature (substrate support temperature): 550° C. The amount of particles (PTCL) and metal contamination (Al and Y) and the resistivity improving effect (resistivity changes (Res.)) were measured while changing the pressure in each of the cases of setting the RF power to 0 W and 100 W (power density: 2.3 kW/m$^2$). The result obtained when the RF power was 0 W is shown in FIG. 13, and the result obtained when the RF power was 100 W (power density: 1.2 kW/m$^2$) is shown in FIG. 14.

Figure 13:
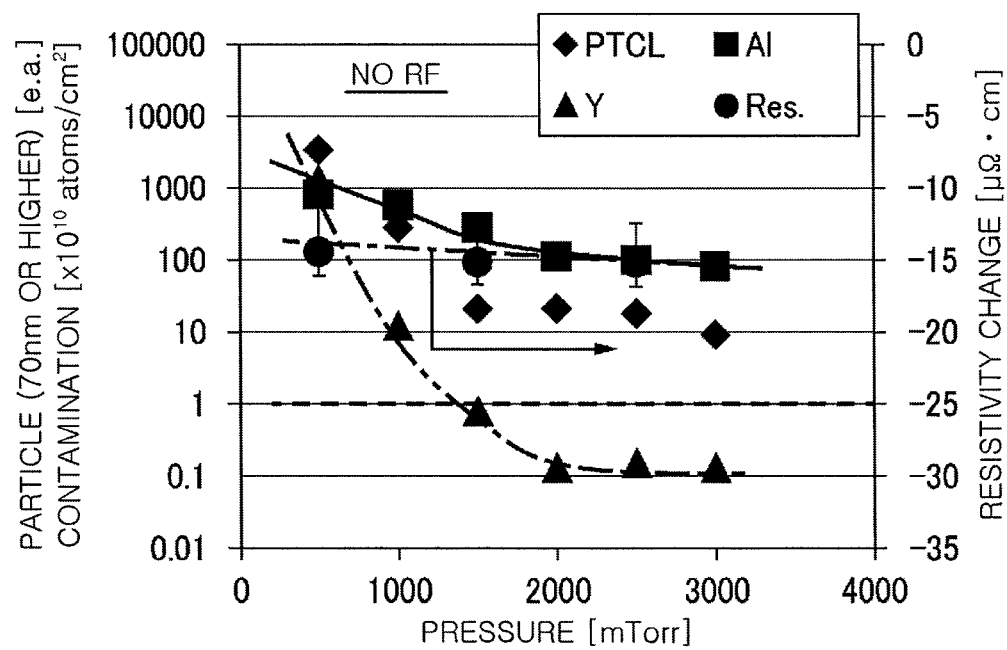
FIG. 13 shows a relationship between a pressure, the amount of particles and metal contamination, and a resistivity improving effect in the case of setting an RF power to 0 W.
Figure 14:
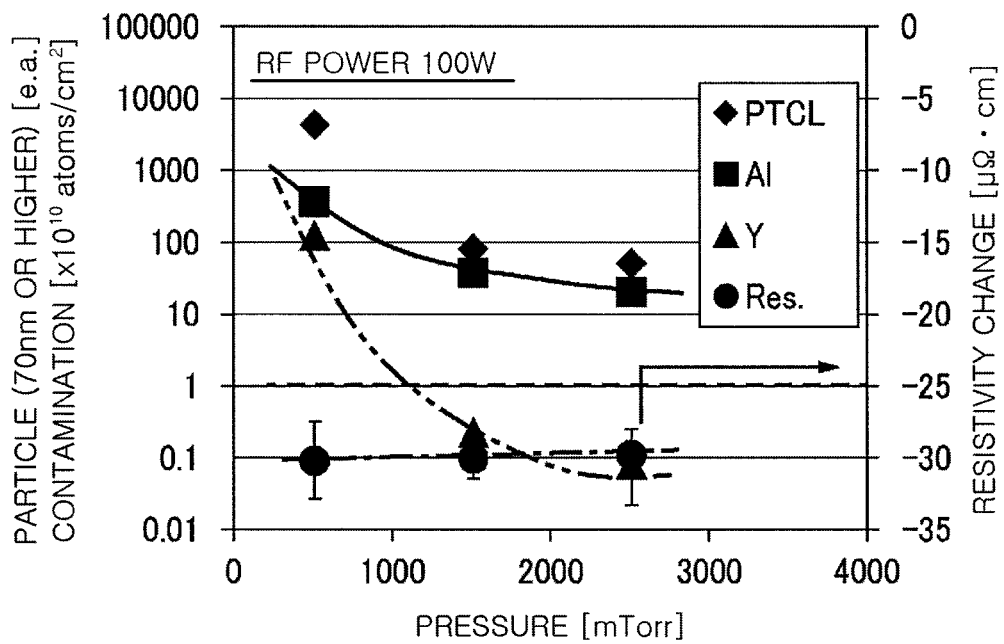
FIG. 14 shows a relationship between a pressure, the amount of particles and metal contamination, and a resistivity improving effect in the case of setting the RF power to 100 W (power density: 1.2 $kW/m^2$).

As shown in FIGS. 13 and 14, regardless of the RF power, the amount of particles (PTCL) and metal contamination (Al and Y) decrease when the pressure becomes 1000 mTorr or higher. Such an effect is desirable when the pressure is 1500 mTorr or more, and preferably 2000 mTorr or more. When the RF power is 0, the resistivity improving effect is small, whereas the resistivity improving effect exceeds a desired target level when the RF power is 100 W.

Figure 15:
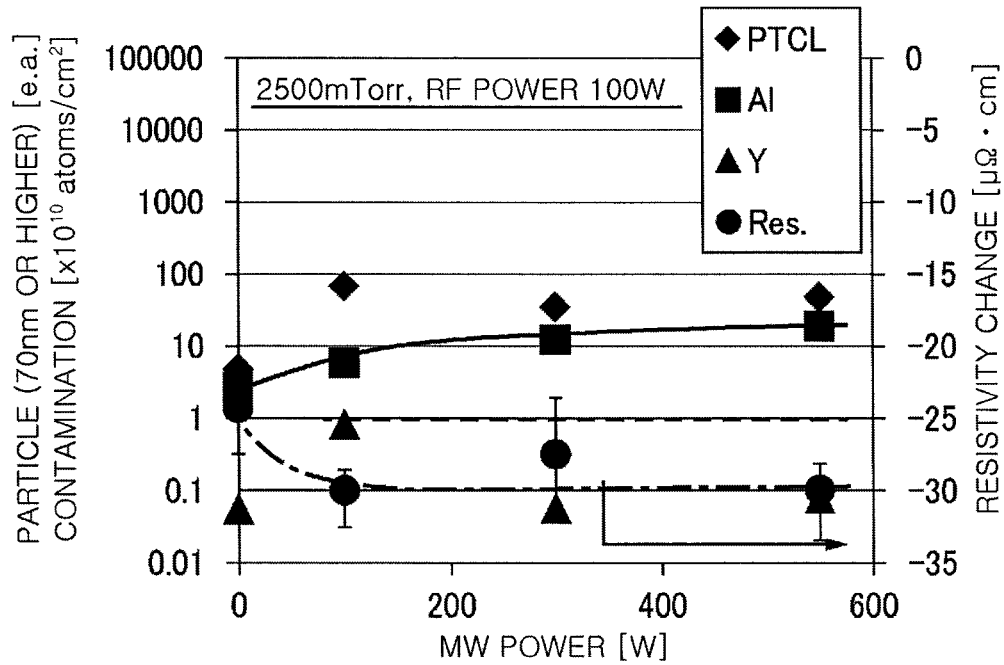
FIG. 15 shows a relationship between a pressure, the amount of particles and metal contamination, and a resistivity improving effect in the case of setting a pressure to 2500 mTorr and the RF power to 100 W.

Next, the basic conditions were set as follows: Ar gas flow rate: 800 sccm, $H_2$ gas flow rate: 200 sccm, substrate temperature (substrate support temperature): 550° C., pressure: 2500 mTorr (333 Pa), and RF power: 100 W, and the microwave power (MW power) was changed. The microwave power (MW power) was set to 0 W, 100 W (power density: 2.3 kW/m$^2$), 300 W (power density: 7.0 kW/m$^2$), and 550 W (power density: 12.9 kW/m$^2$). FIG. 15 shows the amounts of particles (PTCL) and metal contamination (Al and Y) and the resistivity improving effect (resistivity changes (Res.)) in the case of changing the microwave power.

As shown in FIG. 15, the metal contamination was suppressed by decreasing the MW power. However, when the MW power is 0, the resistivity improving effect tends to be low. It can be understood that while the RF power is a dominant factor in enhancing the resistivity improving effect, the MW power is also required for the resistivity improving effect. When the MW power is within a range of 100 W to 300 W (power density: 2.3 kW/m$^2$ to 7.0 kW/m$^2$), the metal contamination reduction effect and the resistivity improving effect are enhanced. Although no test was executed within a range of 0 W to 100 W due to the circumstances of the test equipment, it is predicted that the resistivity improving effect can be obtained at the MW power of about 20 W (power density: 0.5 kW/m$^2$) and also that an improved metal contamination reduction effect can be obtained while maintaining the resistivity improving effect at the power density of 2.3 kW/m$^2$ or less.

<Other Applications>

While various embodiments have been described above, the above-described embodiments of the present disclosure are illustrative in all respects and are not restrictive. Various omissions, substitutions, and changes may be made without departing from the scope of the appended claims and the gist thereof.

For example, in the above-described embodiments, the case where the surface modification and the etching were performed using a hydrogen gas and a halogen-based gas as the reducing gas has been described. However, the plasma processing is not limited thereto as long as a reducing gas is used.

Further, various types of microwave plasma processing apparatuses may be used without being limited to the above example.

DESCRIPTION OF REFERENCE NUMERALS

1: chamber
2: microwave plasma source
3: microwave plasma
4: substrate support
5: RF power supply
6: cathode-coupled plasma
100: plasma processing apparatus
101: chamber
102: substrate support
103: gas supply mechanism
104: gas exhaust mechanism
105: microwave plasma source
106: controller
W: substrate

The invention claimed is:

1. A plasma processing method for generating microwave plasma in a chamber and performing plasma processing on a substrate, comprising:
   arranging the substrate in a region away from a microwave plasma generation region in the chamber;
   setting a pressure in the chamber to 1 Torr (133.3 Pa) or higher;
   introducing microwaves from a microwave plasma source and a processing gas containing a reducing gas into the chamber to generate microwave plasma, and diffusing active species from the microwave plasma in the microwave plasma generation region to the substrate; and
   applying a radio frequency (RF) power to the substrate to generate cathode-coupled plasma near the substrate and attractions near the substrate to the substrate,
   wherein the substrate has a TiN film on a surface thereof, and the plasma processing is surface modification for reducing a resistivity of the TiN film using a hydrogen gas as the reducing gas.

2. The plasma processing method of claim 1, wherein the pressure in the chamber is 1.5 Torr (200 Pa) or higher.

3. The plasma processing method of claim 1, wherein a power density of the microwaves is 10 kW/m$^2$ or less.

4. The plasma processing method of claim 1, wherein the microwave plasma source has a plurality of microwave radiation units configured to radiate microwaves into the chamber.

5. The plasma processing method of claim 1, wherein a power density of the RF power is within a range of 0.3 kW/m$^2$ to 2.3 kW/m$^2$.

6. The plasma processing method of claim 1, wherein a distance from a microwave introducing unit of the microwave plasma source to the substrate in the chamber is within a range of 40 mm to 200 mm.

* * * * *